United States Patent
Ho (10) Patent No.: US 10,439,016 B2
(45) Date of Patent: Oct. 8, 2019

(54) ARRAY SUBSTRATE AND DISPLAY PANEL

(71) Applicant: EverDisplay Optronics (Shanghai) Limited, Shanghai (CN)

(72) Inventor: Jui Ting Ho, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 102 days.

(21) Appl. No.: 15/621,016

(22) Filed: Jun. 13, 2017

(65) Prior Publication Data

US 2018/0197932 A1     Jul. 12, 2018

(30) Foreign Application Priority Data

Jan. 12, 2017   (CN) ............ 2017 1 0023188

(51) Int. Cl.
*H01L 27/12* (2006.01)
*H01L 27/32* (2006.01)

(52) U.S. Cl.
CPC ........ *H01L 27/3276* (2013.01); *H01L 27/124* (2013.01); *H01L 27/1255* (2013.01); *H01L 27/3265* (2013.01)

(58) Field of Classification Search
CPC ..... H01L 27/12; H01L 27/124; H01L 27/125; H01L 27/1255; H01L 27/32; H01L 27/327; H01L 27/3276
USPC .......................................................... 257/40
See application file for complete search history.

(56) References Cited

U.S. PATENT DOCUMENTS 9,698,210 B2 *   7/2017   Cho ................ H01L 27/3279
10,084,030 B2 *   9/2018   Oh ................. H01L 27/3246

* cited by examiner

*Primary Examiner* — Monica D Harrison
(74) *Attorney, Agent, or Firm* — Yunling Ren (57) ABSTRACT

An array substrate includes: a substrate; a first metal layer, disposed on the substrate, the first metal layer forming a gate electrode, a scan line and a first electrode, the scan line extending along a first direction in a plane of a surface of the substrate; a first insulation layer, disposed on the first metal layer; a second metal layer, disposed on the first insulation layer, the second metal layer forming a second electrode, projections of the first electrode and the second electrode on the substrate at least partly overlapping one another; a second insulation layer, disposed on the second metal layer; and a third metal layer, disposed on a side of the second insulation layer away from the second metal layer, the third metal layer forming an initialization signal line.

18 Claims, 7 Drawing Sheets

ARRAY SUBSTRATE AND DISPLAY PANEL

CROSS REFERENCE

The present application is based upon and claims priority to Chinese Patent Application No. 201710023188.5, filed on Jan. 12, 2017, and the entire contents thereof are incorporated herein by reference.

TECHNICAL FIELD

The present disclosure relates to the field of display technology, in particular, to an array substrate and a display panel.

BACKGROUND

Nowadays, organic light emitting diode (OLED) technology is developing rapidly, and has become the foreground technology that will most likely replace the liquid crystal display (LCD).

In the prior art, a display panel includes a plurality of pixels, each of which is driven by a pixel driving circuit. However, it is difficult for the prior art to achieve better display performance in a limited wiring space when the resolution is higher.

It should be noted that, information disclosed in the above background portion is provided only for better understanding of the background of the present disclosure, and thus it may contain information that does not form the prior art known by those ordinary skilled in the art.

SUMMARY

The present disclosure provides an array substrate and a display panel that may improve display performance in high resolution.

According to one aspect, the present disclosure provides an array substrate including: a substrate; a first metal layer, disposed on the substrate, the first metal layer forming a gate electrode, a scan line and a first electrode, the scan line extending along a first direction in a plane of the substrate; a first insulation layer, disposed on a side of the first metal layer away from the substrate; a second metal layer, disposed on a side of the first insulation layer away from the first metal layer, the second metal layer forming a second electrode, projections of the first electrode and the second electrode on the substrate at least partly overlapping one anther; a second insulation layer, disposed on a side of the second metal layer away from the first insulation layer; and a third metal layer, disposed on a side of the second insulation layer away from the second metal layer.

According to another aspect, the present disclosure further provides a display panel, including: the array substrate as described above; and a display element, disposed on the array substrate.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

The above and other features and advantages of the present disclosure will become more apparent by describing its exemplary embodiments in detail with reference to the drawings.

DETAILED DESCRIPTION

Example embodiments will now be described more fully with reference to the accompanying drawings. However, example embodiments may be embodied in a variety of forms and should not be construed as being limited to the embodiments set forth herein; rather, these embodiments are provided such that the present disclosure may be thorough and complete, and will fully convey the concepts of example embodiments to those skilled in the art. Same reference numerals in the drawings indicate the same or similar structures, and thus repeated description thereof will be omitted.

Features, structures, or characteristics described herein may be combined in one or more embodiments in any suitable manner. In the following description, numerous specific details are set forth to give a full understanding of the embodiments of the present disclosure. However, those skilled in the art will appreciate that the technical solutions of the present disclosure may be practiced without one or more of the specific details, or by other methods, components, materials, and the like. In some cases, well-known structures, materials, or operations are not shown or described in detail to avoid obscuring the present disclosure.

The drawings of the present disclosure are intended to show only the relative positional relationship, and the dimensions of certain parts are exaggerated for ease of understanding, the dimensions illustrated in the drawings do not represent proportional relationships of actual dimensions.

Figure 1:
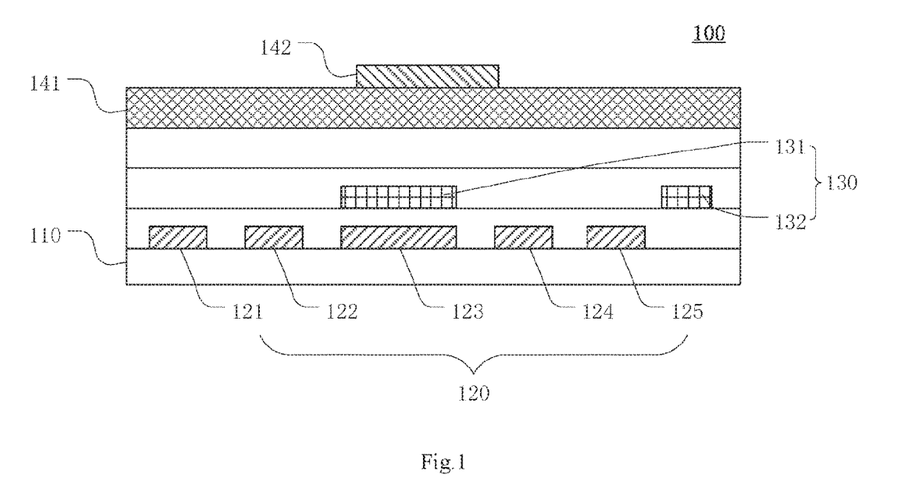
FIG. 1 illustrates a cross sectional view of a display panel according to a comparative embodiment of the present disclosure.

FIG. 1 illustrates a cross section of a display panel according to a comparative embodiment of the present disclosure (in which only one pixel is illustrated). FIG. 1 illustrates a display panel 100 having a resolution of 247 PPI (pixel per inch). In the display panel 100, from top to bottom, it includes sequentially a substrate 110, a first metal layer 120, a second metal layer 130, an organic functional layer 141 and an anode electrode 142. The first metal layer 120 forms a scan line (Sn−1) 121, a scan line (Sn) 122, a first electrode 123, a light emitting signal line (En) 124 and a scan line (Sn+1) 125. The second metal layer 130 forms a second electrode 131 and a Vint signal line 132. The first electrode 123 and the second electrode 131 form a storage capacitor. The Vim signal line 132 receives an initialization signal. Since the cross-sectional view is a cross-sectional view of one pixel of the display panel taken in a direction perpendicular to the extension direction of the scan line, some elements are omitted. However, according to the display panel 100 illustrated in FIG. 1, in one pixel, there are five signal lines parallel to the extension direction of the scan line, including the scan line (Sn−1) 121, the scan line (Sn) 122, the scan line (Sn+1) 125, the light emitting signal line (En) 124, and the Vint signal line 132. When the structure is applied to a high-resolution display panel, it is difficult to form the five signal lines parallel to the extension direction of the scan line in one pixel due to the limited wiring space.

Figure 2:
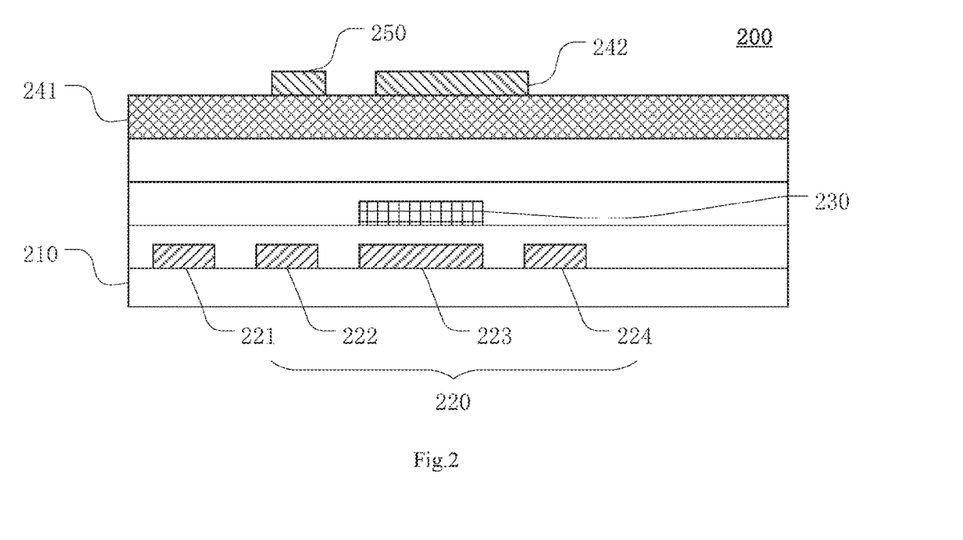
FIG. 2 illustrates a cross sectional view of a display panel according to another comparative embodiment of the present disclosure.

A cross-sectional view of another display panel a comparative embodiment is illustrated in FIG. 2 (in which only one pixel is illustrated). FIG. 2 illustrates a display panel 200 having a resolution of 448 PPI. In the display panel 200, from top to bottom, it includes sequentially a substrate 210, a first metal layer a second metal layer, an organic functional layer 241, and an anode electrode layer. The first metal layer 120 forms a scan line (Sn−1) 221, a scan line (Sn) 222, a first electrode 223, and a light emitting signal line (En) 224. The second metal layer forms a second electrode 230. The anode electrode layer forms an anode electrode 242 and a Vint signal line 250. The first electrode 223 and the second electrode 230 form a storage capacitor. The Vint signal line 250 receives an initialization signal. Since the cross-sectional view is a cross-sectional view of one pixel of the display panel taken in a direction perpendicular to the extension direction of the scan line, some elements are omitted. However, in the display panel 200 illustrated in FIG. 2, the Vint signal line 250 cannot be formed using the second metal layer 230 due to insufficient wiring space, and instead it is formed using the anode electrode layer and spaced away from the anode electrodes 242 by a certain distance. Accordingly, the area of the anode electrodes 242 is limited, thereby affecting the light emitting area.

Figure 3:
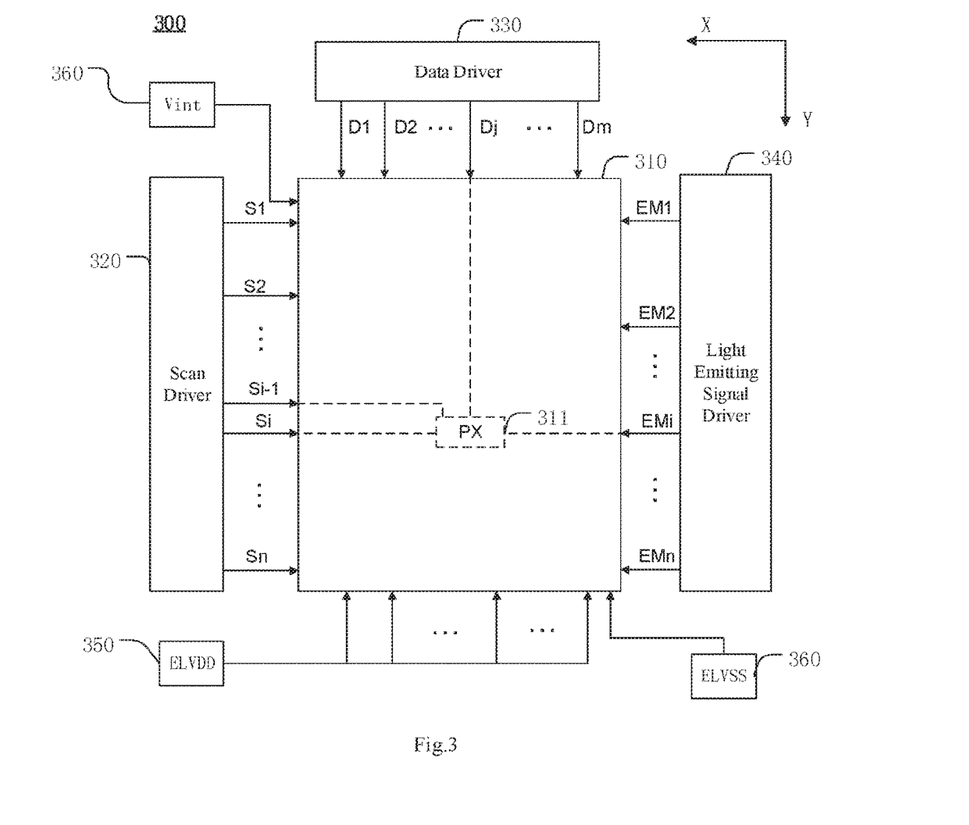
FIG. 3 is a schematic view of a display device having a display panel according to the present disclosure.

FIG. 3 is a schematic view of a display device having a display panel according to the present disclosure. The display device is an OLED display device 300. Referring to FIG. 3, the OLED display device 300 includes at least a display panel 310, a scan driver 320, and a data driver 330. The OLED display device 300 may further include other devices and/or elements, for example, the OLED display device 300 may further include a light emitting signal driver 340.

The scan driver 320 may generate a scan signal. The light emitting signal driver 340 may generate a light emitting control signal. The scan signal generated in the scan driver 320 may be provided sequentially to the scan lines (S1 to Sn). The light emitting control signal generated in the light emitting signal driver 340 may also be provided sequentially to each of the light emitting control lines (EM1 to EMn). The scan signal and the light emitting signal may also be provided to the scan lines S1 to Sn and the light emitting control lines EM1 to EMn without being in sequence, respectively. In other embodiments, the light emitting control signal may also be generated by the scan driver 320.

The data driver 330 may receive an input signal, e.g., RGB data, and may generate a data signal corresponding to the received input signal. The data signal generated in the data driver 330 may be provided to the pixel panel 310 through data lines (D1 to Dm), so as to be synchronized with the scan signal. The data signal may also be provided to the data lines D1 to Dm without being synchronized with the scan signal.

The display panel 310 may display an image corresponding to an external supplied common power signal ELVDD 350 and an external supplied grounding signal ELVSS 360. The display panel 310 may further display an image corresponding to the scan signal generated by the scan driver 320 and supplied from the scan lines S1 to Sn, the light emitting control signal supplied from the light emitting control lines EM1 to EMn, and the data signal generated by the data driver 330 and supplied from the data lines D1 to Dm.

The display panel 310 may include a plurality of pixels 311 connected to the scan lines (S1 to Sn), the light emitting control lines (EM1 to EMn), the data lines (D1 to Dm), a plurality of common power lines (connected to the common power signal ELVDD 350), a plurality of initialization signal lines (connected to the initialization signal Vint), and a grounding signal ELVSS 360. The plurality of scan lines (S1 to Sn), the plurality of light emitting control lines (EM1 to EMn), and the plurality of initialization signal lines extend in the X direction (i.e., the first direction). The plurality of common power lines and the plurality of data lines (D1 to Dm) extend in the Y direction i.e., the second direction, perpendicular to the first direction). Regions formed by the intersection of the plurality of scan lines (S1 to Sn) and the plurality of data lines (D1 to Dm) define pixel regions for respective pixels 311. In particular, each pixel 311 receives a first scan signal of the scan line Sn, a second scan signal of the scan line a light emitting control signal of the light emitting control line EMn, the initialization signal Vint, a data signal of the data line Dj, the common power signal ELVDD 350 and the grounding signal ELVSS 360.

Figure 4:
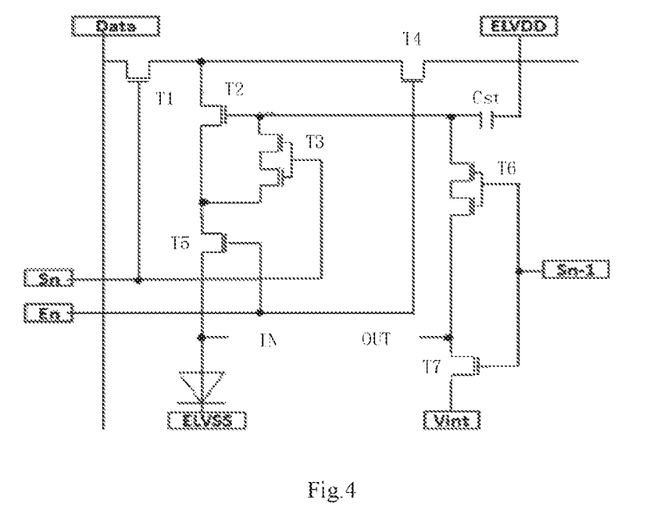
FIG. 4 is a schematic view of a pixel driving circuit according to an embodiment of the present disclosure.

Next, referring to FIG. 4, a pixel driving circuit of a pixel will be described. FIG. 4 illustrates totally 7 (seven) TFTs T1-T7, a capacitor Cst and an organic light emitting diode (MED).

A gate electrode of the TFT T1 is connected to the scan line Sn to receive the first scan signal, and the scan line Sn intersects the pixel region in which the pixel driving circuit is disposed. A first electrode of the TFT T1 is connected to the data line Data to receive the data signal. A second electrode of the TFT T1 is connected to a first electrode of the TFT T2.

A gate electrode of the TFT T2 is connected to a first electrode of the TFT T3. The first electrode of the TFT T2 is connected to the second electrode of the TFT T1. A second electrode of the TFT T2 is connected to a second electrode of the TFT T3.

A gate electrode of the TFT T3 is connected to the scan line Sn to receive the first scan signal. The first electrode of the TFT T3 is connected to the gate electrode of the TFT T2. The second electrode of the TFT T3 is connected to the second electrode of the TFT T2.

A gate electrode of the TFT T4 is connected to the light emitting signal line En to receive the light emitting control signal. A first electrode of the TFT is connected to the first electrode of the TFT T1. A second electrode of the TFT T4 is connected to the common power line ELVDD to receive the common power signal.

A gate electrode of the TFT T5 is connected to the light emitting signal line En to receive the light emitting control signal. A first electrode of the TFT T5 is connected to the second electrode of the TFT T2. A second electrode of the TFT T5 is connected to an anode of the OLED. A cathode of the OLED is connected to the grounding signal ELVSS.

A gate electrode of the TFT T6 is connected to the scan line Sn−1 to receive the second scan signal, the scan line Sn−1 intersects a pixel region adjacent to the pixel region in which the pixel driving circuit is disposed along a direction in which the data line is extending. A first electrode of the TFT T6 is connected to the gate electrode of the TFT T2. A second electrode of the TFT T6 is connected to a first electrode of the TFT T7.

A gate electrode of the TFT T7 is connected to the scan line Sn−1 to receive the second scan signal. A first electrode of the TFT T7 is connected to the second electrode of the TFT T2. A second electrode of the TFT T7 is connected to the initialization signal line Vint to receive the initialization signal. Optionally, the initialization signal may be a DC voltage that initializes the pixel driving circuit before a next data signal is written.

A first electrode of the capacitor Cst is connected to the gate electrode of the TFT T2. A second electrode of the capacitor Cst is connected to the common power line ELVDD to receive the common power signal.

A reset output signal OUT is further connected between the first electrode of the TFT T7 and the second electrode of the TFT T6. The reset output signal OUT is connected to a reset input signal IN of the next pixel driving circuit adjacent to the pixel region in which the pixel driving circuit is disposed along a direction in which the data line is extending. A reset input signal IN is further connected between the cathode of the OLED and the grounding signal ELVSS. The reset input signal IN is connected to the reset output signal OUT of the previous pixel driving circuit adjacent to the pixel region in which the pixel driving circuit is disposed along a direction in which the data line is extending. When the second scan signal of the scan line Sn−1 of the pixel driving circuit turns on the TFT T7, such that the initialization signal line Vint is connected to receive the initialization signal, and the reset input signal IN of the other pixel driving circuit connected to the reset output signal OUT is updated.

The above described first electrode and second electrode of the TFTs refer to the source electrode and the drain electrode, respectively.

FIG. 4 illustrates only one implementation of the pixel driving circuit. Those skilled in the art may implement many various pixel driving circuits including a plurality of TFTs and a storage capacitor and receiving the above respective signals, so as to control the OLED.

Figure 5:
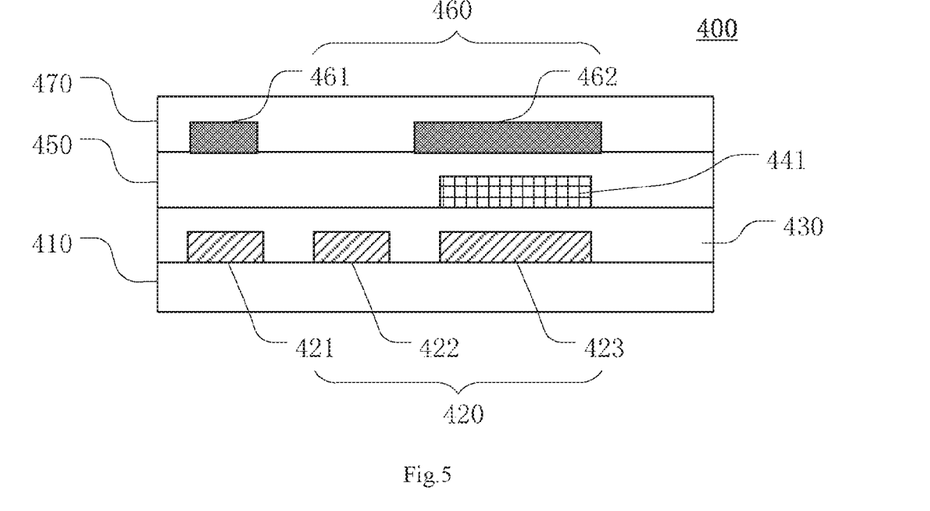
FIG. 5 illustrates a cross sectional view of an array substrate according to an embodiment of the present disclosure.

FIG. 5 illustrates a cross sectional view of an array substrate according to an embodiment of the present disclosure. In particular, FIG. 5 illustrates a cross sectional view of one pixel region of the array substrate 400 along a direction perpendicular to the first direction (e.g., the X direction illustrated in FIG. 3).

The array substrate 400 includes a substrate 410, a first metal layer 420, a first insulation layer 430, a second metal layer, a second insulation layer 450 and a third metal layer 460. The substrate 410 may be a flexible substrate or a glass substrate.

The first metal layer 420 is disposed on the substrate 410. The first metal layer 420 forms a gate electrode, a scan line 421 and a first electrode 423. The scan line 421 extends along the first direction (e.g., the X direction illustrated in FIG. 3) in a plane of the array substrate 400. Optionally, the first metal layer 420 may further form a light emitting signal line 422. The light emitting signal line 422 extends along the first direction (e.g., the X direction illustrated in FIG. 3) in the plane of the surface of the substrate 410. As illustrated in FIG. 5, one pixel region intersects only one scan line 421. Also, one pixel region intersects only one light emitting signal line 422. Herein, the term "only" is used for limiting the number of the scan line 421 and the light emitting signal line 422 intersecting one pixel region, rather than limiting the type of the signal lines intersecting one pixel region. The first insulation layer 430 is disposed on a side of the first metal layer 420 away from the substrate 410.

The second metal layer is disposed on a side of the first insulation layer 430 away from the first metal layer 420. The second metal layer forms a second electrode 441. Projections of the second electrode 441 and the first electrode 423 on the substrate 410 at least partly overlap one another. The second insulation layer 450 is disposed on a side of the second metal layer away from the first insulation layer 430.

The third metal layer 460 is disposed on a side of the second insulation layer 450 away from the second metal layer. The third metal layer 460 forms an initialization signal line 461. The initialization signal line 461 (e.g., the initialization signal line Vint illustrated in FIG. 4) extends along the first direction (e.g., the X direction illustrated in FIG. 3) in a plane of the surface of the substrate 410. According to such a configuration, the initialization signal line 461 is formed by the third metal layer 460, thereby reducing the effect of the initialization signal line on the wiring space of other metal layers in the plane of the array substrate 400.

In particular, the third metal layer 460 further forms a third electrode 462. Projections of the third electrode 462 and the second electrode 441 on the substrate 410 at least partly overlap one another. Accordingly, the third electrode 462, the second electrode 441 and the first electrode 423 integratedly form a storage capacitor (e.g., the storage capacitor Cst illustrated in FIG. 4). According to such a configuration, it is able to increase the area of the storage capacitor, improve the performance of the storage capacitor and improve the light emitting effect of the pixel driving circuit.

Optionally, the array substrate 400 further includes a third insulation layer 470 and a fourth metal layer. The third insulation layer 470 is disposed on a side of the third metal layer 460 away from the second insulation layer 450. The fourth metal layer is disposed on a side of the third insulation layer 470 away from the third metal layer 460. The fourth metal layer forms a source electrode, a drain electrode and a data line. The data line extends along a second direction (e.g., the Y direction perpendicular to the X direction illustrated in FIG. 3) in the plane of the array substrate 400. In particular, the array substrate 400 includes a plurality of scan lines 421 (e.g., S1 to Sn illustrated in FIG. 3) and a plurality of data lines e.g., D1 to Dm illustrated in FIG. 3), and the plurality of scan lines 421 (e.g., S1 to Sn illustrated in FIG. 3) intersects the plurality of data lines (e.g., D1 to Dm illustrated in FIG. 3) to define a plurality of pixel regions (reference numeral 311 illustrated in FIG. 3). The plurality of pixel regions is arranged along a first direction (e.g., the X direction illustrated in FIG. 3) and a second direction (e.g., the Y direction illustrated in FIG. 3) in a matrix form. A pixel driving circuit (e.g., the pixel driving circuit as illustrated in FIG. 4) is disposed in each of the pixel regions, and the pixel driving circuit in each of the pixel regions includes: a plurality of thin film transistors (TFT) and a storage capacitor. The TFT is formed of the gate electrode formed by the first metal layer 420 and the source and drain electrodes formed by the fourth metal layer. The storage capacitor is formed of the first electrode 423 formed by the first metal layer 420, the second electrode formed by the second metal layer and the third electrode 462 formed by the third metal layer.

Figure 6:
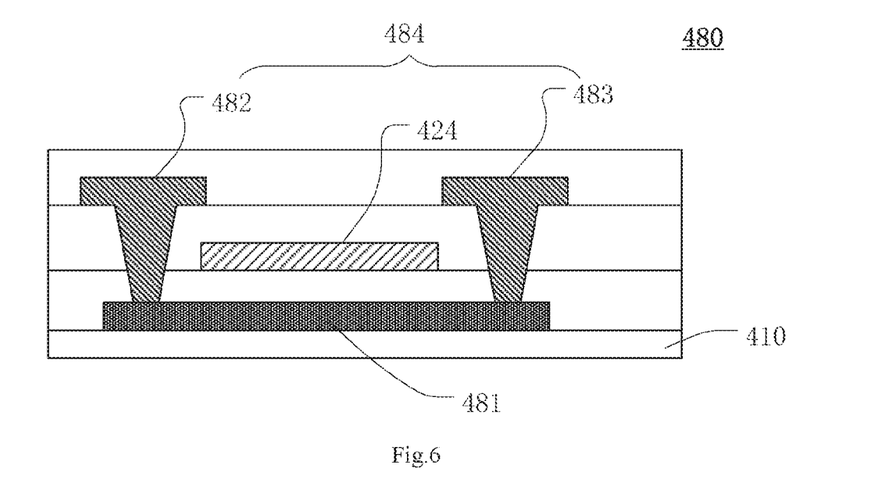
FIG. 6 illustrates a cross sectional view of a TFT according to an embodiment of the present disclosure.

An exemplary cross sectional view of the TFT of the pixel driving circuit may refer to FIG. 6. FIG. 5 and FIG. 6 are taken along different directions, and thus FIG. 5 and FIG. 6 illustrate different parts. The TFT 480 includes an active layer 481, a gate electrode 424 and a gate electrode 482 and a source electrode 483 formed by the fourth metal layer 484 sequentially formed on the substrate 410. An insulation layer is interposed between the active layer 481 and the gate electrode 424. An insulation layer is interposed between the gate electrode 424 and the fourth metal layer 484. The insulation layer interposed between the gate electrode 424 and the fourth metal layer 484 may include for example the first insulation layer 430, the second insulation layer 450 and the third insulation layer 470 illustrated in FIG. 5. The structure of the TFT according to the present disclosure is not limited thereto, for example, the TFT may be a top gate TFT, a bottom gate TFT or a double gate TFT. Further, the fourth metal layer 484 further forms a common power line. The pixel driving circuits of two pixel regions adjacent along the first direction (e.g., the X direction illustrated in FIG. 3) share one common power line.

Further, although each pixel region intersects only one scan line, the pixel driving circuit thereof should receive a first scan signal and a second scan signal (e.g., Sn and Sn−1 illustrated in FIG. 4). In one embodiment, the first scan signal is supplied from the scan line that intersects the pixel region in which the pixel driving circuit is disposed. The second scan signal is supplied from the scan line that intersects a previous pixel region adjacent to the pixel region in which the pixel driving circuit is disposed in the second direction.

Figure 7:
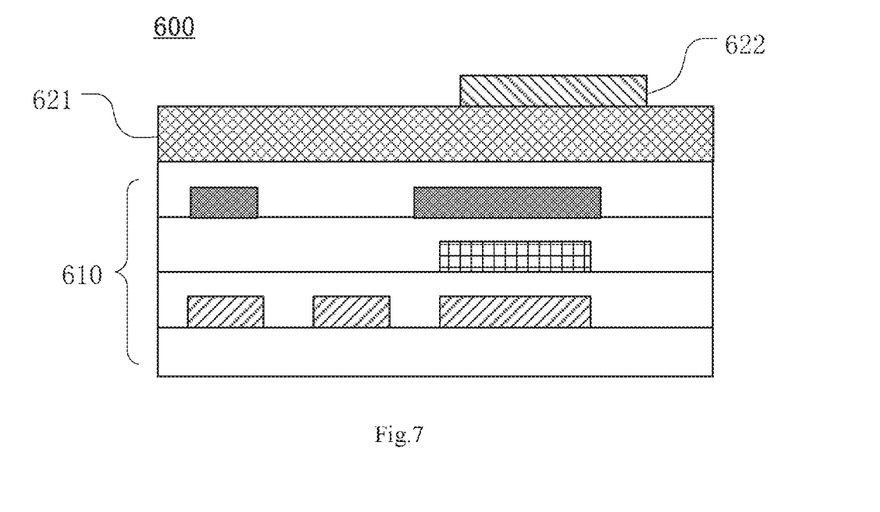
FIG. 7 illustrates a cross sectional view of a display panel according to an embodiment of the present disclosure.

Hereinafter, reference is made to FIG. 7. FIG. 7 illustrates a cross sectional view of a display panel according to an embodiment of the present disclosure. The display panel 600 includes an array substrate 610 and a display element disposed on the array substrate 610. The array substrate 610 includes a structure similar to that of the array substrate 400 illustrated in FIG. 5. Optionally, the display element is an OLED element including a cathode electrode, an organic functional layer 621 and an anode 622. Optionally, a resolution of the display panel 600 is greater than 500 PPI. For example, the resolution may be 734 PPI.

The present disclosure has the following beneficial effects over the prior art:

i) the initialization signal line is formed by the third metal layer, thereby reducing the effect of the initialization signal line on the wiring space of other metal layers in the plane of the array substrate;

ii) the third electrode is formed using the third metal layer, such that the third electrode, the first electrode and the second electrode form the storage capacitor, thereby increasing an area of the storage capacitor;

iii) two pixel driving circuits adjacent along the first direction share one common power line, thereby reducing the wiring space occupied by the common power line; and iv) the arrangement of the initialization signal line does not affect the arrangement of respective electrodes of the display element, thereby resolving the effect of the initialization signal line on an light emitting area in the case of high resolution.

Exemplary implementations of the present disclosure have been illustrated and described in detail hereinabove. It should be appreciated that the present disclosure is not limited to the disclosed implementations, rather, it is intended that the present disclosure intends to cover various modifications and equivalent alternatives within the scope of the appended claims.

What is claimed is:

1. An array substrate, comprising:
a substrate;
a first metal layer, disposed on the substrate, the first metal layer forming a gate electrode, a scan line and a first electrode, the scan line extending along a first direction in a plane of a surface of the substrate;
a first insulation layer, disposed on a side of the first metal layer away from the substrate;
a second metal layer, disposed on a side of the first insulation layer away from the first metal layer, the second metal layer forming a second electrode, projections of the first electrode and the second electrode on the substrate at least partly overlapping one anther;
a second insulation layer, disposed on a side of the second metal layer away from the first insulation layer; and
a third metal layer, disposed on a side of the second insulation layer away from the second metal layer,
wherein the third metal layer forms an initialization signal line and a third electrode, projections of the third electrode and the second electrode on the substrate at least partly overlap one another, and the third electrode, the second electrode and the first electrode integratedly form a storage capacitor.

2. An array substrate, comprising:
a substrate;
a first metal layer, disposed on the substrate, the first metal layer forming a gate electrode, a scan line and a first electrode, the scan line extending along a first direction in a plane of a surface of the substrate;
a first insulation layer, disposed on a side of the first metal layer away from the substrate;
a second metal layer, disposed on a side of the first insulation layer away from the first metal layer, the second metal layer forming a second electrode, projections of the first electrode and the second electrode on the substrate at least partly overlapping one anther;
a second insulation layer, disposed on a side of the second metal layer away from the first insulation layer;
a third metal layer, disposed on a side of the second insulation layer away from the second metal layer;
a third insulation layer, disposed on a side of the third metal layer away from the second insulation layer; and
a fourth metal layer, disposed on a side of the third insulation layer away from the third metal layer, wherein the fourth metal layer forms a source electrode, a drain electrode and a data line, and the data line extends along a second direction in a plane of the substrate, and wherein the second direction is perpendicular to the first direction.

3. The array substrate according to claim 2, wherein the array substrate comprises a plurality of scan lines and a plurality of data lines, the plurality of scan lines intersect the plurality of data lines to define a plurality of pixel regions, wherein the plurality of pixel regions are arranged along the first direction and the second direction in a matrix form.

4. The array substrate according to claim 3, wherein a pixel driving circuit is disposed in each of the pixel regions, and each of the pixel driving circuit comprises:
a plurality of thin film transistors (TFT) formed of the gate electrode, the source electrode and the drain electrode; and
one said storage capacitor, formed of the first electrode, the second electrode and the third electrode.

5. The array substrate according to claim 4, wherein one said pixel region intersects only one said scan line.

6. The array substrate according to claim 5, wherein the pixel driving circuit in each of the pixel regions is configured to receive:
- a first scan signal, supplied from the scan line that intersects the pixel region in which the pixel driving circuit is disposed; and
- a second scan signal, supplied from the scan line that intersects a previous pixel region adjacent to the pixel region in which the pixel driving circuit is disposed in the second direction.

7. The array substrate according to claim 4, wherein the fourth metal layer further forms a common power line, and pixel driving circuits of two pixel regions adjacent in the first direction share one said common power line.

8. The array substrate according to claim 4, wherein the first metal layer further forms a light emitting signal line, and one said pixel region intersects only one said light emitting signal line.

9. A display panel, comprising:
- an array substrate; and
- a display element, disposed on the array substrate,
- wherein the array substrate comprises:
- a substrate;
- a first metal layer, disposed on the substrate, the first metal layer forming a gate electrode, a scan line and a first electrode, the scan line extending along a first direction in a plane of a surface of the substrate;
- a first insulation layer, disposed on a side of the first metal layer away from the substrate;
- a second metal layer, disposed on a side of the first insulation layer away from the first metal layer, the second metal layer forming a second electrode, projections of the first electrode and the second electrode on the substrate at least partly overlapping one anther;
- a second insulation layer, disposed on a side of the second metal layer away from the first insulation layer; and
- a third metal layer, disposed on a side of the second insulation layer away from the second metal layer,
- wherein the third metal layer forms an initialization signal line and a third electrode, projections of the third electrode and the second electrode on the substrate at least partly overlap one another, and the third electrode, the second electrode and the first electrode integratedly form a storage capacitor.

10. The display panel according to claim 9, wherein the display element is an OLED element.

11. The display panel according to claim 9, wherein a resolution of the display panel is greater than 500 pixels per inch (PPI).

12. The display panel according to claim 9, wherein the array substrate further comprising:
- a third insulation layer, disposed on a side of the third metal layer away from the second insulation layer; and
- a fourth metal layer, disposed on a side of the third insulation layer away from the third metal layer, wherein the fourth metal layer forms a source electrode, a drain electrode and a data line, and the data line extends along a second direction in a plane of the substrate, and wherein the second direction is perpendicular to the first direction.

13. The display panel according to claim 12, wherein the array substrate comprises a plurality of scan lines and a plurality of data lines, the plurality of scan lines intersect the plurality of data lines to define a plurality of pixel regions, wherein the plurality of pixel regions are arranged along the first direction and the second direction in a matrix form.

14. The display panel according to claim 13, wherein a pixel driving circuit is disposed in each of the pixel regions, and each of the pixel driving circuit comprises:
- a plurality of thin film transistors (TFT) formed of the gate electrode, the source electrode and the drain electrode; and
- one said storage capacitor, formed of the first electrode, the second electrode and the third electrode.

15. The display panel according to claim 14, wherein one said pixel region intersects only one said scan line.

16. The display panel according to claim 15, wherein the pixel driving circuit in each of the pixel regions is configured to receive:
- a first scan signal, supplied from the scan line that intersects the pixel region in which the pixel driving circuit is disposed; and
- a second scan signal, supplied from the scan line that intersects a previous pixel region adjacent to the pixel region in which the pixel driving circuit is disposed in the second direction.

17. The display panel according to claim 14, wherein the fourth metal layer further forms a common power line, and pixel driving circuits of two pixel regions adjacent in the first direction share one said common power line.

18. The display panel according to claim 14, wherein the first metal layer further forms a light emitting signal line, and one said pixel region intersects only one said light emitting signal line.

* * * * *